(12) United States Patent
Wu

(10) Patent No.: US 7,279,975 B2
(45) Date of Patent: Oct. 9, 2007

(54) DIFFERENTIAL CIRCUIT WITH OFFSET CONTROL

(76) Inventor: Zuoguo Wu, 1652 Hope Dr., No. 1331, Santa Clara, CA (US) 95054

( * ) Notice: Subject to any disclaimer, the term of this patent is extended or adjusted under 35 U.S.C. 154(b) by 96 days.

(21) Appl. No.: 11/317,225

(22) Filed: Dec. 22, 2005

(65) Prior Publication Data

US 2007/0146073 A1    Jun. 28, 2007

(51) Int. Cl.
*H03F 3/45* (2006.01)

(52) U.S. Cl. ........................ 330/258; 330/253
(58) Field of Classification Search .............. 330/58, 330/53, 9, 1–4, 95
See application file for complete search history.

(56) References Cited

U.S. PATENT DOCUMENTS 6,388,519 B1 *  5/2002  Tachimori ................. 330/253
6,774,720 B2 *  8/2004  Ikeda et al. ................ 330/253
7,113,040 B2 *  9/2006  Nguyen ..................... 330/253

OTHER PUBLICATIONS

U.S. Appl. No. 11/091,227—filed Mar. 28, 2005, entitled "Data Receiver Including a Transconductance Amplifier", Inventor(s), Zuoguo Wu, et al. (File No. 042390.P19460).

* cited by examiner

*Primary Examiner*—Henry Choe

(57) ABSTRACT

There are four differential pairs, where each has first and second legs. The first pair is to receive a first data signal at its first leg, and a second data signal at its second leg. The second pair is to receive a first offset signal at its first leg, and a second offset signal at its second leg. The third pair is to receive the first data signal at its first leg, and the second offset signal at its second leg. The fourth pair is to receive the first offset signal at its first leg, and the second data signal at its second leg. Other embodiments are also described and claimed.

17 Claims, 5 Drawing Sheets

DIFFERENTIAL CIRCUIT WITH OFFSET CONTROL

An embodiment of the invention relates to correcting the offset of a differential amplifier. Other embodiments are also described.

BACKGROUND

Differential amplifiers are often used in high performance analog and mixed-signal integrated circuits, as part of a buffer or gain block. In their most typical uses, differential amplifiers exhibit structural symmetry that allows the amplifier to provide good rejection to common mode and power supply noise. An output of a differential amplifier is a measure of the difference between a pair of input signals, so that if the differential amplifier is made of matched transistor devices (e.g., ones that are structural replicates of each other and, accordingly, exhibit very similar DC and AC electrical characteristics), then common mode noise occurring at the inputs of the amplifier or the power supply is significantly reduced at its output.

A differential amplifier uses a differential transistor pair whose transistors are typically matched. However, due to random variations in the manufacturing process, some unintended mismatch may still exist in the manufactured parts. This type of mismatch contributes to an "offset" during operation of the amplifier. In other words, if the input signals to the differential amplifier were at equal levels, an output of the amplifier ideally should be zero (being a measure of the difference between equal input levels). However, in practice, the output exhibits an appreciable, non-zero level referred to as output offset. The offset becomes greater when the differential amplifier design is realized using manufacturing processes that exhibit smaller transistor feature sizes or process geometry. In particular, it has been found that the offset is roughly inversely proportional to the square root of the area of the transistor devices that are used in the differential pair.

Offset correction is becoming increasingly important in high speed circuits that use differential amplifiers, e.g. data communications receivers that operate at symbol rates of 1 GHz and higher. An example is a receiver used in a high speed I/O channel such as a Common System-level Interface (CSI) by Intel Corp. of Santa Clara, Calif. In that technology, transistor devices with relatively short channel lengths, e.g. well below 100 nanometers, are used to achieve fast operation. A differential amplifier using such short channel devices also calls for an offset correction circuit, to alleviate the offset.

An existing method of offset correction adds an offset differential pair, to the input differential pair of the amplifier. The offset differential pair is coupled in parallel with the input pair, that is, a pair of its output terminals share common nodes with a pair of the output terminals of the input pair. The offset correction circuit includes additional circuitry such as a digital to analog converter that generates a differential offset signal that is applied to the offset pair in an amount that is expected to reduce the offset of the amplifier.

BRIEF DESCRIPTION OF THE DRAWINGS

The embodiments of the invention are illustrated by way of example and not by way of limitation in the figures of the accompanying drawings in which like references indicate similar elements. It should be noted that references to "an" embodiment of the invention in this disclosure are not necessarily to the same embodiment, and they mean at least one.

DETAILED DESCRIPTION

A way of extending the offset correction range in a differential circuit is described. As mentioned above, differential amplifiers that use short channel devices exhibit increased offset (in large part believed to be attributed to unintentional device mismatch). It would be desirable to have an offset correction circuit that has an extended range that would be effective for use with such differential circuits. In addition, an extended offset correction range advantageously allows a characterization process to be applied to the differential circuit, to determine its worst case operating margin. This is also referred to as an "on-die oscilloscope" function in which an offset value is swept to, for example, detect the boundaries of the eye opening of a data receiver.

Figure 1:
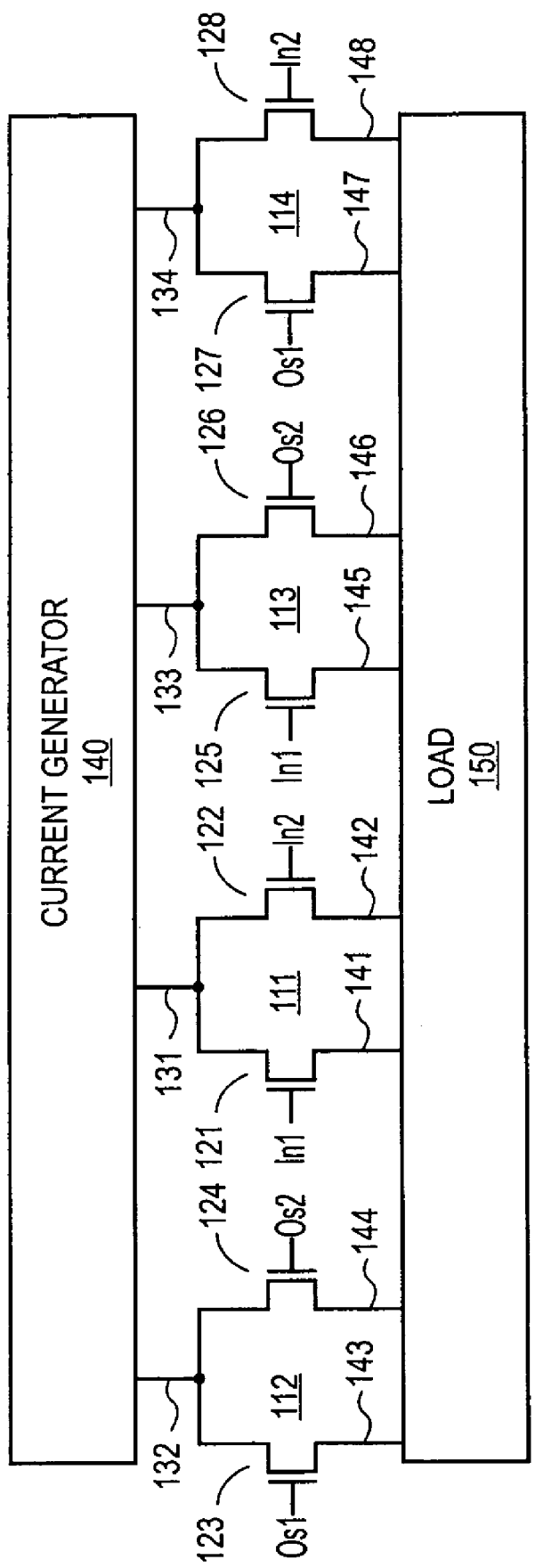
FIG. 1 shows a circuit schematic of a differential circuit with offset control, according to an embodiment of the invention.

Beginning with FIG. 1, a diagram of a differential circuit 104 with offset control that permits an extended offset correction range is shown, in accordance with an embodiment of the invention. The differential circuit 104 has four differential pairs 111-114. Each differential pair has a first leg and a second leg. For differential pair 111, its first leg 121 is to receive a first data signal In1, while its second leg 122 is to receive another data signal, In2. These data signals are treated by the differential circuit as the input signals to be amplified, compared, or simply buffered (at some output node of the differential circuit 104).

The differential circuit 104 also has a second differential pair 112 whose first leg 123 is to receive a first offset signal OS1 and a second leg 124 is to receive another offset signal OS2. OS1 and OS2 are analog signals that may be set by a digital to analog converter (not shown). Their values are selected to cancel an output offset that appears when an equal pair of data signals In1, In2 have been applied to the first differential pair 111. As explained below, the offset signals OS1, OS2 may be DC signals that are swept to characterize the differential circuit, e.g. as part of an on-die oscilloscope function.

In the example of FIG. 1, each differential pair 111-114 has a pair of insulated gate or field effect transistor devices whose source nodes are connected at a common, tail node (for differential pair 111, tail node 131). The transistors of each differential pair may be matched. In some cases, all four of the differential pairs may be matched. Conventional matching techniques may be used in this case, to, for example, have all eight of the transistors shown in FIG. 1 to be replicates of each other. In addition, the four differential pairs may be laid out or arranged in such a way that helps reduce differences between their DC bias levels.

A current generator circuit 140 is coupled to source or sink the required current for maintaining a DC bias at each differential pair, through their respective tail current nodes 131-134. As to their outputs, each differential pair has a pair of output terminals or nodes 141-148 that are coupled to a load circuit 150. Each leg 121-128 has a respective output node 141-148.

Still referring to FIG. 1, the differential circuit 104 also has a third differential pair 113 and a fourth differential pair 114. The first pair 113 has its first leg 125 receiving the first data signal In1, while its second leg 126 receives the second offset signal OS2. In contrast, the fourth differential pair 114 has its first leg 127 receiving the first offset signal OS1, and its second leg receiving the second data signal In1. Note that from an implementation point of view, such an arrangement of the data and offset signals may be achieved by connecting the gate terminal of the transistor in the first leg 121 to that of the transistor in the first leg 125; the gate terminal of the transistor in the second leg 124 to the gate terminal of the transistor in the second leg 126; the gate terminal of the transistor in the first leg 131 to that of the first leg 125; and finally, the gate terminal of the transistor in the second leg 122 to that of the second leg 128.

The arrangement of FIG. 1 is expected to extend the offset correction range of the differential circuit as a whole. This may be measured, for example, by the differential signal across the output nodes 141, 142, or by the "input referred offset". Input referred offset is understood here as referring to the DC voltage (In+-In−) required to reach perfectly balanced outputs, in other words, the input voltage needed to exactly counter the mismatches in the circuit. Input referred offset is more often used as a circuit performance parameter, since it can be easily compared to the signal level at the data input.

Extending the offset correction range allows not only the DC or static offset of the differential circuit 104 to be increased, but also prevents the AC gain from dropping too much. This benefit has been evaluated by a circuit simulation of the example embodiment of FIG. 2.

Figure 2:
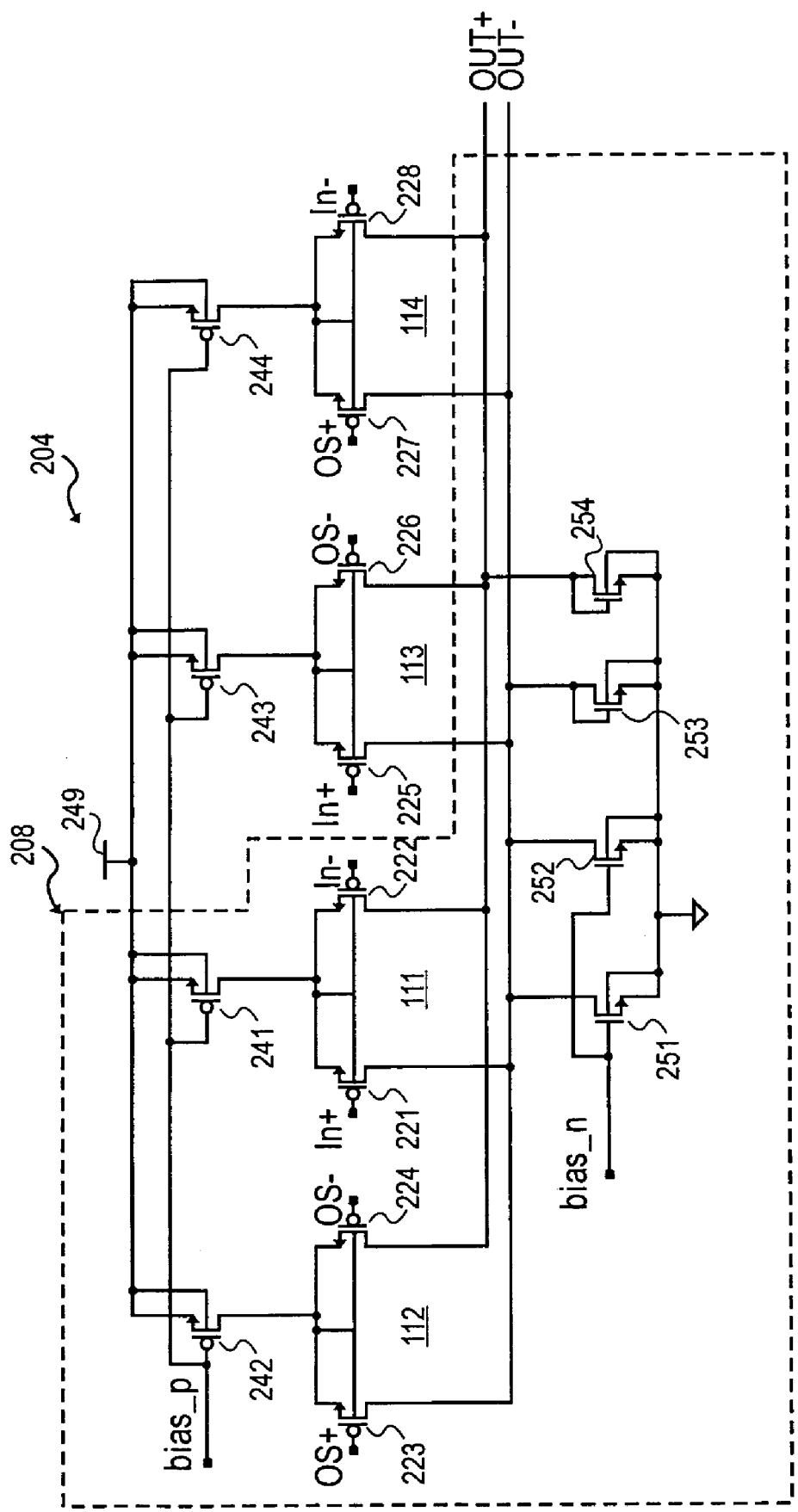
FIG. 2 is a circuit schematic of differential amplifiers with offset control having example current generator and load circuits, and using P-channel transistors.

The circuit diagram of FIG. 2 depicts two different differential amplifiers 204, 208 whose AC gain characteristics versus offset voltage were simulated and compared, to examine the benefits of adding the third and fourth differential pairs 113, 114 (see FIG. 1). The first and second data signals are a differential signal In+, In−, while the offset signals are a differential offset signal OS+, OS−. In this embodiment, P-channel field effect or insulated gate transistors 221-228 are used to implement the differential pairs 111-114 of FIG. 1. The current generator circuit 140 has been implemented using P-channel transistors 241-244 that source current from a positive supply rail 249 into the tail current nodes of their respective differential pairs 111-114. In this example, each of the transistors 241-244 receives the same DC voltage bias_p at its gate terminal, to help set a DC bias current for each differential pair.

For the load circuit 150, the outputs of all four differential pairs are coupled in parallel so that there are two output nodes for the differential amplifier (out+ and out−). N-channel transistors 251, 252 provide current sinks to the respective out− and out+ nodes, as determined by a DC voltage, bias_n. In addition, the load circuit 150, in this example, also includes a pair of diode-connected N-channel transistors 253, 254, to sink further current from their respective output nodes, out−, out+. Of course, the bias and load arrangement shown in FIG. 2 is just one example of a wide range of different circuit implementations for the current generator circuit 140 and load circuit 150 that can be readily determined by one of ordinary skill in the art, to place the differential amplifier in an appropriate DC bias and load setting.

The performance of a differential amplifier 204 with suitable input signal level and a range of offset signal was simulated and compared to the differential amplifier 208. Note that the amplifier 208 differs from amplifier 204 in that the former does not have differential pairs 113, 114 or their associated tail current transistors 243, 244. Nonetheless, differential amplifier 208 does exhibit a reasonable offset correction range, by applying a suitable offset differential signal OS+, OS− to just differential pair 112.

Figure 3:
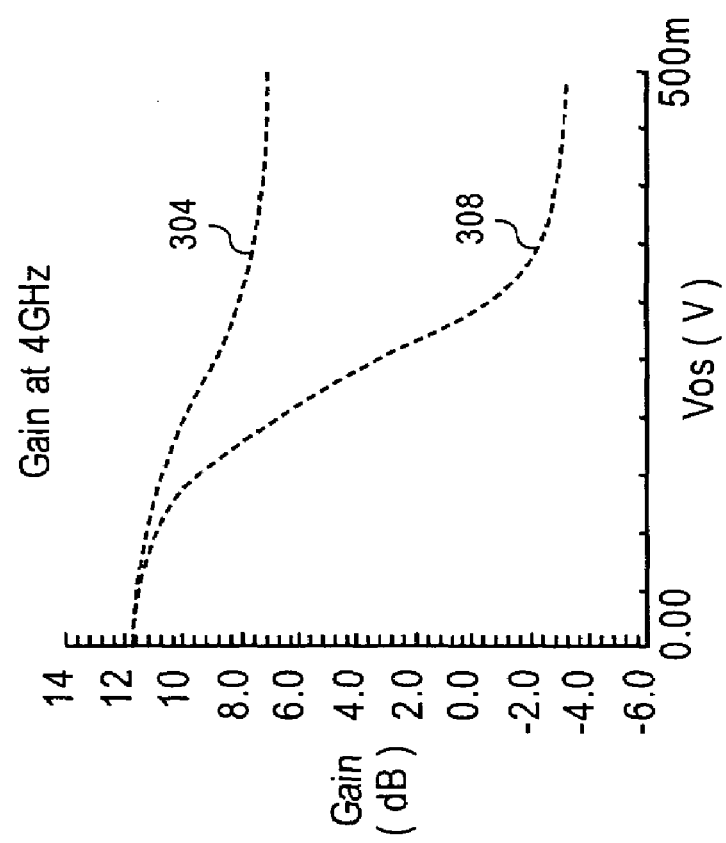
FIG. 3 is a simulation plot of AC gain versus differential offset voltage applied to the different differential amplifiers depicted in FIG. 2.

FIG. 3 shows the AC gain versus input referred differential offset voltage at 4 Ghz. Vos is a DC value needed at In+-In− to correct the circuit mismatches so that the two output nodes are at equal voltages. The actual offset correction is applied through OS+ and OS− (which may or may not be the same voltage as would be applied at In+ and In− to achieve the correction). Plot 304 refers to the measured gain of differential amplifier 204, while plot 308 is the measured gain of the amplifier 208. For the latter, note how the AC gain drops off fairly dramatically above 100 millivolts offset. If an offset correction of more than 100 millivolts is needed for differential amplifier 208, its AC operation will suffer significantly. In addition, with gain having dropped to essentially 0 dB above 250 millivolts of offset, amplifier 208 becomes unsuitable for use in capturing the full eye opening of a data receiver in which the differential amplifier 208 is used at the front end of a symbol detection scheme (to be described further below).

Figure 4:
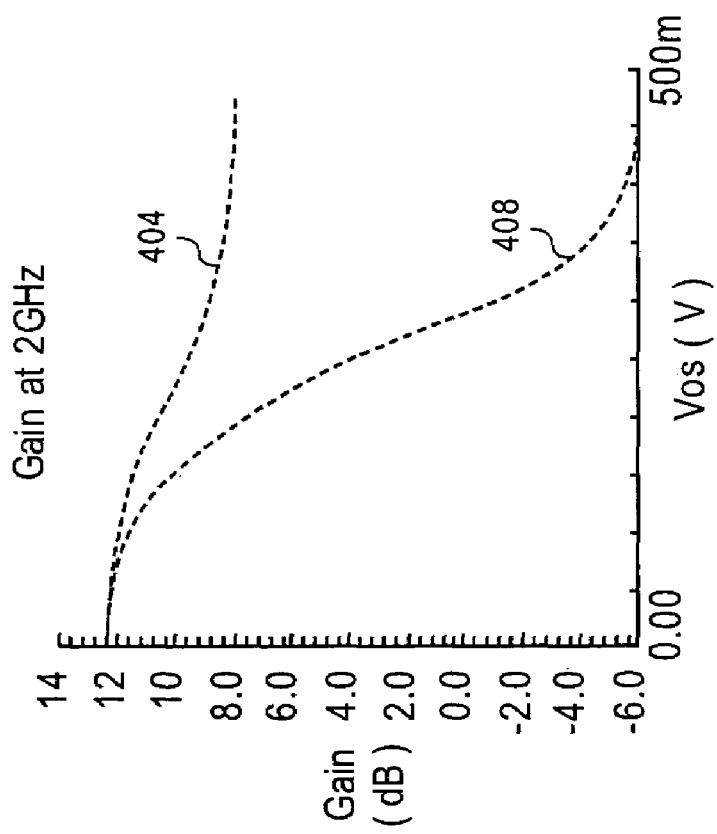
FIG. 4 is another simulation plot of AC gain versus differential offset voltage for the differential amplifiers.

In contrast, the amplifier 204 exhibits much less gain roll off above 100 millivolts, and maintains appreciable gain of more than 6 dB even up to 500 millivolts of offset. It is believed that the two additional differential pairs 113, 114 counter balance the weakened transconductance (AC gain) of the first and second pairs 111, 112, therefore extending the offset correction range. The improvement is even greater at a lower frequency. See, for example, FIG. 4, where plot 404 is the measured gain of amplifier 204 and plot 408 is the measured gain of amplifier 208, at 2 GHz input.

Figure 5:
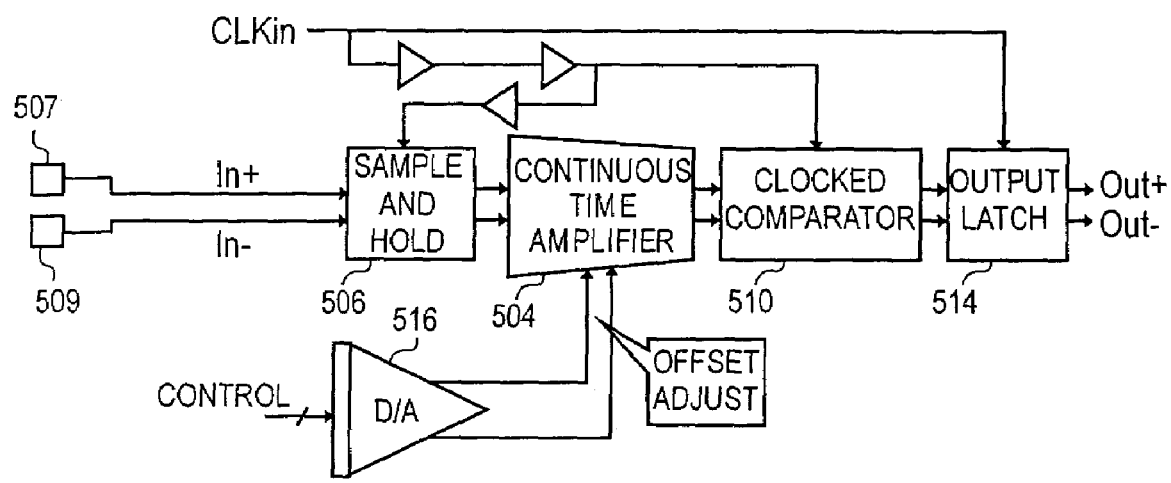
FIG. 5 is a block diagram of a data receiver and offset correction circuitry.

Turning now to FIG. 5, a block diagram of a data receiver and offset correction circuit, in accordance with an embodiment of the invention, is shown. The elements shown may be implemented in a single integrated circuit die, for example, as part of an I/O interface of the die. The interface includes a pair of pads 507, 509 which are coupled to the input terminals of a data receiver on which a differential signal In+, In− is delivered from the pads. The data receiver includes a continuous time amplifier 504 with a differential input coupled to a differential output of an optional sample and hold circuit 506. The differential output of the amplifier 504 is fed to a comparator 510. In this embodiment, the sample and hold circuit 506 and the comparator 510 are clocked by the same receiver clock (CLKin). An output of the comparator is coupled to an output latch 514 that stores the value of a symbol that has been detected by the comparator 510 in the amplified input signal In+, In−. An output of the latch 514 is then sent to a deserializer (not shown).

The continuous time amplifier 504 features a differential amplifier in accordance with an embodiment of the invention, with offset correction capability. A pair of analog offset signals (offset adjust) are fed to the differential amplifier from a differential output of a digital to analog converter (D/A) 516. The input of the digital to analog converter 516 is a multi-bit binary value (Control). This digital control value may have been generated by a training loop or other feedback mechanism (not shown) that adjusts the differential offset signal to the amplifier 504 for a sequence of incoming symbols, until the detected symbol pattern shows a failure or error. This may indicate the boundary of the eye opening of the receiver, in one direction. Sweeping the offset in the other direction, until a similar failure or error occurs in the detected symbol pattern, will mark another boundary of the eye opening. The extended offset correction range that is available in the differential circuit design of FIG. 1 helps capture the full eye opening in most instances. It should be noted that in practice, the actual eye boundary may be defined by the difference between (a) the voltage (OS+, OS−) that corrects for the offset and (b) the voltage (OS+, OS−) that causes a failure.

Figure 6:
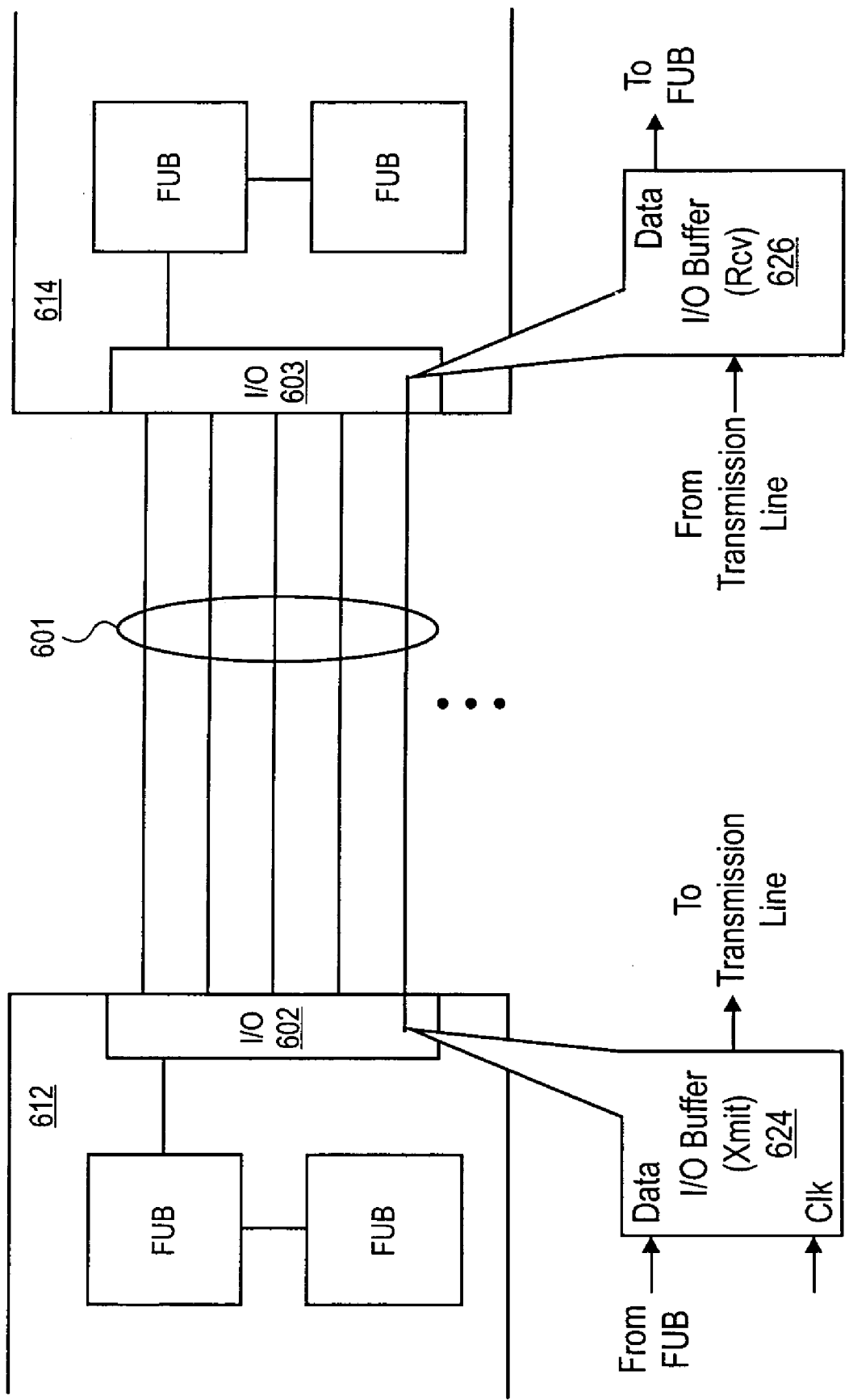
FIG. 6 is a block diagram of part of a system in which a data receiver, in accordance with an embodiment of the invention may be used.

Referring now to FIG. 6, a block diagram of part of a system is shown in which a pair of integrated circuit components 612, 614 are coupled to each other by a data communications channel being, in this example, a multilane, point-to-point serial link. Each IC component has an I/O interface 602, 603 that is on-chip with one or more functional unit blocks (FUBs) that are coupled to receive data through the I/O interface. For example, the IC component 612 may include a central processing unit that communicates over transmission lines 601 (which are part of the data communications channel) with the IC component 614 which is a system interface chipset, interconnect switch, bridge, I/O controller hub, or other part of the I/O interconnect of the system (e.g., part of the main memory subsystem). The transmission lines 601 may be formed in a carrier substrate (e.g., a baseboard printed wiring board) on which the IC components 612, 614 are also installed, and may include board-to-board connectors. The respective I/O interfaces 602, 603 have transmit and receive I/O buffers 624, 626 that are considered to be part of the data communications channel and that translate between on-chip signaling (used by the FUBs) and off-chip or transmission line signaling. Each I/O buffer 624, 626 has one or more data ports, namely a data input and/or a data output, to receive or send a sequence of data symbols from or to an on-chip FUB. Each I/O buffer 624, 626 also has a respective transmission line port, which is AC or DC coupled to one of the transmission lines 601. For example, each transmit I/O buffer 624 may be in a separate lane of a multilane, serial link. In addition, each transmit I/O buffer has a clock input that is to receive a clock that it uses for timing its transmit events, i.e. sending the data symbols into a transmission line 601. Each I/O buffer has a data receiver in accordance with any of the arrangements described above (e.g., FIG. 5), to receive the data symbols from a transmission line.

It should be noted that the data receivers described here may be used in systems other than the one shown in FIG. 6. For example, the IC components 612, 614 may be part of a memory subsystem in which one of the IC components is a random access memory or advanced memory buffer device that is coupled to the other IC component by a fully buffered dual inline memory module (or fully buffered DIMM, FBD) channel.

The invention is not limited to the specific embodiments described above. For example, although the circuit diagrams show each differential pair only as a single pair of field effect transistors or insulated gate transistors, the differential pair may be implemented differently, such as using other types of transistor structures (e.g., bipolar junction transistors) or more than two individual active devices (e.g., implementing each transistor that is shown in the diagrams as two or more transistors that are coupled in parallel). Also, any numerical values given above, such as in the simulation results, should not be construed as limiting, but rather merely illustrative of the capabilities of the different embodiments of the invention. In addition, the example P-channel input amplifier 204 of FIG. 2 is not the only application of the differential circuit depicted in FIG. 1. Other applications of the differential circuit include N-channel input amplifiers, buffers, and comparators. Accordingly, other embodiments are within the scope of the claims.

What is claimed is:

1. A differential circuit with offset control, comprising:
    a first differential pair having a first leg and a second leg, the first leg to receive a first data signal, the second leg to receive a second data signal;
    a second differential pair having a first leg and a second leg, the first leg to receive a first offset signal, the second leg to receive a second offset signal;
    a third differential pair having a first leg and a second leg, the first leg to receive the first data signal, the second leg to receive the second offset signal; and
    a fourth differential pair having a first leg and a second leg, the first leg to receive the first offset signal, the second leg to receive the second data signal.

2. The differential circuit of claim 1 wherein each of the differential pairs comprises: a pair of matched, insulated gate transistors whose source terminals are coupled to a tail current node.

3. The differential circuit of claim 2 further comprising a current generator circuit coupled to the tail current nodes.

4. The differential circuit of claim 3 wherein each of the differential pairs comprises a pair of outputs.

5. The differential circuit of claim 4 further comprising a load circuit coupled to said outputs.

6. The differential circuit of claim 1 wherein each of the differential pairs comprises a pair of outputs, wherein said pairs of outputs are parallel coupled to each other.

7. An integrated circuit comprising:
    a pair of pads;
    an offset correction circuit; and
    a data receiver having
        a first differential amplifier with first and second input terminals coupled to the pair of pads,
        a second differential amplifier having first and second input terminals coupled to a pair of outputs of the offset correction circuit,
        a third differential amplifier having a first input terminal coupled to the first input terminal of the first differential amplifier, and a second input terminal coupled to the second input terminal of the second differential amplifier, and
        a fourth differential amplifier having a first input terminal coupled to the first input terminal of the second differential amplifier, and a second input terminal coupled to the second input terminal of the first differential amplifier.

8. The integrated circuit of claim 7 wherein each of the differential amplifiers comprises a pair of outputs, wherein said outputs are parallel coupled to each other.

9. The integrated circuit of claim 7 further comprising a sample and hold circuit coupled between the first and second input terminals of the first differential amplifier and the pair of pads.

10. The integrated circuit of claim 9 further comprising a clocked comparator having a pair of inputs coupled to a pair of outputs of the first differential amplifier.

11. The integrated circuit of claim 10 further comprising a latch coupled to an output of the comparator.

12. The integrated circuit of claim 7 wherein the offset correction circuit comprises a digital to analog converter having a pair of outputs that are coupled to the first and second input terminals, respectively, of the second differential amplifier.

13. A system comprising:
first and second integrated circuit components coupled to each other by a data communications channel in which a data receiver has a first differential amplifier to receive a pair of data signals, a second differential amplifier to receive a pair of offset signals, a third differential amplifier to receive one of the data signals and one of the offset signals, and a fourth differential amplifier to receive the other of the data signals and the other of the offset signals.

14. The system of claim 13 wherein each of the differential amplifiers comprises a pair of outputs, wherein said outputs are parallel coupled to each other.

15. The system of claim 14 wherein the data communications channel comprises a fully buffered DIMM channel.

16. The system of claim 14 wherein the first integrated circuit component comprises a processor and the second integrated circuit component comprises memory.

17. The system of claim 16 wherein the data communications channel comprises a multi-lane serial point-to-point link.

* * * * *